(12) United States Patent
Busardo et al.

(10) Patent No.: US 10,655,215 B2
(45) Date of Patent: May 19, 2020

(54) TREATMENT METHOD USING A BEAM OF SINGLY- OR MULTIPLY-CHARGED GAS IONS IN ORDER TO PRODUCE COLORED METALS

(71) Applicant: QUERTECH, Caen (FR)

(72) Inventors: Denis Busardo, Gonneville-sur-Mer (FR); Frédéric Guernalec, Liffre (FR)

(73) Assignee: IONICS FRANCE, Hérouville-Saint-Clair (FR)

( * ) Notice: Subject to any disclaimer, the term of this patent is extended or adjusted under 35 U.S.C. 154(b) by 0 days.

(21) Appl. No.: 16/070,963

(22) PCT Filed: Jan. 17, 2017

(86) PCT No.: PCT/FR2017/050099
§ 371 (c)(1),
(2) Date: Jul. 18, 2018

(87) PCT Pub. No.: WO2017/125675
PCT Pub. Date: Jul. 27, 2017

(65) Prior Publication Data
US 2019/0032198 A1    Jan. 31, 2019

(30) Foreign Application Priority Data
Jan. 20, 2016    (FR) ..................... 16 00107

(51) Int. Cl.
| | | |
|---|---|---|
| *C23C 14/48* | (2006.01) | |
| *C23C 14/00* | (2006.01) | |
| *C23C 14/58* | (2006.01) | |
| *C23C 14/04* | (2006.01) | |
| *G04B 15/14* | (2006.01) | |
| *C23C 14/35* | (2006.01) | |
| *G04B 37/22* | (2006.01) | |
| *G04B 45/00* | (2006.01) | |

(52) U.S. Cl.
CPC .......... *C23C 14/48* (2013.01); *C23C 14/0015* (2013.01); *C23C 14/042* (2013.01); *C23C 14/355* (2013.01); *C23C 14/582* (2013.01); *C23C 14/5806* (2013.01); *G04B 15/14* (2013.01); *G04B 37/22* (2013.01); *G04B 45/0076* (2013.01)

(58) Field of Classification Search
CPC ..... C23C 14/48; C23C 14/355; C23C 14/582; C23C 14/0015
See application file for complete search history.

(56) References Cited

U.S. PATENT DOCUMENTS

| 4,568,396 A | 2/1986 | Vardiman |
| 5,303,574 A * | 4/1994 | Matossian ................ G01N 3/56 |
| | | 356/402 |
| 2011/0236592 A1 | 9/2011 | Busardo |

FOREIGN PATENT DOCUMENTS

| CN | 102021525 A | 4/2011 |
| WO | WO-2008/043964 A2 | 4/2008 |
| WO | WO-2010/063928 A1 | 6/2010 |

OTHER PUBLICATIONS

International Application No. PCT/FR2017/050099, Written Opinion, dated May 22, 2017.
International Search Report for Application No. PCT/FR2017/050099, dated May 22, 2017.

* cited by examiner

*Primary Examiner* — Jessee R Roe
(74) *Attorney, Agent, or Firm* — Marshall, Gerstein & Borun LLP

(57) ABSTRACT

The disclosure relates to a treatment method for coloring a metal that includes a) bombardment of the metal with a beam of singly- or multiply-charged gas ions produced by an electron cyclotron resonance source; b) heat treatment in ambient air so as to color the implanted metal using a temperature between 100° C. and 400° C. and an exposure time of between 1 minute and 4 hours.

16 Claims, 2 Drawing Sheets

TREATMENT METHOD USING A BEAM OF SINGLY- OR MULTIPLY-CHARGED GAS IONS IN ORDER TO PRODUCE COLORED METALS

CROSS-REFERENCE TO RELATED APPLICATIONS

This present application is the U.S National Phase of PCT Application No. PCT/FR2017/050099 filed Jan. 17, 2017, which claims the benefit of priority of France Patent Application No. 1600107 filed on Jan. 20, 2016, the respective disclosure of which are incorporated herein by reference in their entireties.

BACKGROUND

Field of the Disclosure

A subject matter of the invention is a process for the treatment of a metal material by a beam of mono- and multicharged ions of a gas; this process is targeted at producing varied and highly reproducible colors, as a replacement for PVD deposits, in order to decorate parts, for example made of steels or of titanium alloys or else of aluminum alloys. The process of the invention applies in particular to watchmaking parts in order to give them a unique esthetic appearance, both with regard to the sharpness of the patterns and with regard to the diversity and reproducibility of the colors. Mention will be made, among the watchmaking parts which may form the subject of this type of treatment, of pallets, wheels, hands, watch plates, and the like. Mention will also be made of jewelry or else decorative objects in the field of the art of entertaining (knife, lid, teapot, and the like).

Brief Description of Related Technology

The watchmaking industry has already, for a good number of years, been using the technology of PVD coatings for its metal surface decorations. The process is complex, in particular as regards the control of the thicknesses of layers for producing colors.

SUMMARY

PVD Coatings

The principle of the coatings obtained by the PVD technology has been relatively well known for a number of years. It is briefly restated: in a chamber placed under vacuum, a metal sheet, known as target, is formed of the metal which it is desired to deposit. A negative potential of a few hundred volts is applied to this target. A gas capable of forming a plasma (Ar) is introduced. Under the action of the electric field of the cathode, the Ar is converted into $Ar^+$ ions which will be held against the target at high speed (several thousand km/s).

Under the repeated impacts, atoms of the target are torn off and will be deposited on the part to be coated placed at a calculated distance from the target.

Items of PVD equipment remain, despite everything, complex and expensive assemblies used by highly qualified personnel. The key part of these machines indisputably remains the magnetron cathode. Furthermore, it was the invention of the latter in the 1970s which made possible the industrial development of PVD coatings, hitherto a mere laboratory curiosity.

It was noticed, at this time, that, by superimposing a perpendicular (constant or variable) magnetic field on the electric field applied to the cathode, success was achieved in trapping the electrons close to the target (as a result of their low mass) and in preventing them from being lost in diffuse manner by impacting the walls of the machine. As a result, this high concentration of electrons in the vicinity of the target made it possible to very significantly increase the rates of deposition and to propel this technique towards the industrial sector.

The PVD coatings currently used may be reactive or nonreactive. The nonreactive PVD coatings exhibit a more limited interest. In this case, the metal which forms the target is simply deposited on a substrate. These coatings can, however, be advantageous either for metals which are difficult to deposit by electroplating (for example titanium) or for alloys which are impossible to otherwise deposit (stainless steel alloy coating).

Reactive PVD is for its part more advantageous but much more complex as it makes it possible, starting from metals, to obtain ceramics having noteworthy properties which are not synthesized naturally on the Earth as the pressure and temperature conditions do not allow it. It is thus possible, starting from nitrogen ($N_2$), to form nitrides; starting from a hydrocarbon ($CH_4$ or $C_2H_2$), to synthesize carbides; or else, starting from oxygen ($O_2$), oxides.

It is also possible to combine several gases or several metals at the same time. The result, in a complex way, comes in several shades which it is not possible to obtain by electroplating. It is thus possible to obtain coatings which start from a very white-gray to arrive at deep black. It is also possible to range from yellow to brown or from blue to purple. The range of shades is far from being complete; new hues are still being studied by the majority of professionals of the vacuum technique (this is the case, for example, for red).

The technology of PVD depositions can exhibit disadvantages inherent in the quality of the cleaning of the surfaces before deposition, in the differentiated wear of the metal target, in the control and in the homogeneity of the PVD layers according to the geometry and position of the parts in the chamber, in the colorimetric control of the multilayers, in the change of gas from one deposited layer to another, in the residual contaminations when there is a change in session in order to produce a layer having a different composition, and finally in the economic costs brought about by all these disadvantages.

With regard to the technical performance qualities, the PVD layers have a marked columnar structure which is more or less dense according to the deposition parameters. This structure results in a corrosion resistance which is good in standard surroundings but not always sufficient under severe or very severe conditions. The layers have a thickness which generally varies from 0.5 to 3 µm.

A recent commercial study carried out within the reveals that, among watchmakers using vacuum coatings: 75% used PVD coatings, 4% only use exclusively DLC coatings and, finally, 16% use the two techniques combined.

It is an aim of the invention to offer a treatment method for coloring metals which is relatively inexpensive, which is easy to implement and which makes it possible to treat surfaces corresponding to the needs of numerous applications. Mention will be made, among these applications, of: watchmaking parts, parts of the art of entertaining (knives, lids, plates, and the like).

The invention provides a treatment method which guarantees perfect reproducibility of the shade chosen, which makes possible the drawing of micrometric patterns, for example by means of masking. This can constitute a tool for combatting counterfeiting.

The invention thus provides a treatment process for coloring a metal, characterized in that it comprises several successive stages consisting of:
  a) a bombardment of the metal by a beam of mono- and multicharged ions of a gas which are produced by an electron cyclotron resonance (ECR) source, where:
   the dose of mono- and multicharged ions of the gas which are implanted per unit of surface area is chosen within a range of between $10^{16}$ ions/cm$^2$ and $10^{19}$ ions/cm$^2$;
   the acceleration voltage is chosen within a range of between 5 kV and 1000 kV;
  b) a heat treatment for coloring the implanted metal, where:
   a temperature of between 100° C. and 600° C., for example between 100° C. and 400° C., is chosen;
   an exposure time of between 1 min and 4 hours is chosen.

The bombardment of the metal by a beam of mono- and multicharged ions of a gas is thus a treatment prior to the heat treatment.

As regards ease of implementation, the heat treatment can be carried out in an ambient air oven. It should be remembered that ambient air is characterized by a pressure of 1 bar and a predominant composition made of 79% nitrogen ($N_2$) and 18% oxygen ($O_2$). It is possible to imagine a heat treatment under different conditions, for example by replacing ambient air with a combination of gases, such as oxygen, methane, and the like. The partial pressures of the components of the gas of the heat treatment can, for example, be chosen in order to promote the appearance of colors other than those obtained in ambient air. Preliminary experimental tests can be carried out for this purpose.

The inventors have been able to observe that a treatment process for coloring metals, in particular steels, comprising a bombardment by a beam of mono- and multicharged ions of a gas which are produced by an electron cyclotron resonance (ECR) source is more effective than a process comprising a bombardment by a beam of monocharged ions of a gas.

"Mono- and multicharged ions of a gas" is understood to mean ions of one and the same gas exhibiting different charge states, both monocharged and multicharged.

According to one embodiment, the mono- and multicharged ions of the gas are all ions of one and the same atomic compound, for example of one and the same atom or of one and the same diatomic molecule.

According to one embodiment, the atomic compound is a gas at ambient temperature.

According to an embodiment, the beam of mono- and multicharged ions of the gas comprises 10% of multicharged ions or more than 10% of multicharged ions.

According to an embodiment, the beam of mono- and multicharged ions of the gas comprises 30% of multicharged ions or more than 30% of multicharged ions.

According to one embodiment, the mono- and multicharged ions of the gas of the beam of ions are selected from the ions of the elements of the list of the "noble" gases consisting of helium (He), neon (Ne), argon (Ar), krypton (Kr) and xenon (Xe).

According to another embodiment, the mono- and multicharged ions of the gas of the beam of ions are selected from the ions of the gases of the list consisting of nitrogen ($N_2$) and oxygen ($O_2$).

According to one embodiment, the mono- and multicharged ions of the gas of the beam of ions are ions of nitrogen ($N_2$).

According to one embodiment, the metal is at ambient temperature during the treatment with the mono- and multicharged nitrogen ions (bombardment by the beam of ions).

According to another embodiment, the metal is at a temperature greater than ambient temperature during the treatment with the mono and multicharged nitrogen ions (bombardment by the beam of ions), for example at a temperature which makes possible the diffusion of the ions into the metal ("implantation/diffusion" method).

The choice of the dose of mono- and multicharged ions of the gas per unit surface area within the dose range according to the invention can result from a preliminary calibration stage where a sample consisting of the metal material envisaged is bombarded with one of the mono- and multicharged ions of a gas, for example He, Ne, Ar, Kr, X, $N_2$ or $O_2$. Bombardment of this metal material can be carried out in different regions of the metal material with a plurality of doses of mono- and multicharged ions of a gas, within the range according to the invention. The colorimetric results obtained on immersing this metal material in an ambient air oven at a temperature of between 100° C. and 400° C. (for example 200, 250, 300 and 350° C.) for different exposure times which can vary between 1 min and 4 h are subsequently observed. It is possible, on the basis of these results, to rapidly record the change in the coloration of the treated regions (graph) so as to be able to chose, directly or by extrapolation, a dose, a temperature and an exposure time corresponding to the shade desired.

The regions treated can thus be observed by simple observation techniques, such as observation by the naked eye under an angle of incidence of 10° and 70° for assessing the shade or else the moiré phenomena of interference origin which may be associated with it. It is also possible to determine the coloration obtained by any appropriate colorimetry method.

Without wishing to be bound by any one scientific theory, it may be thought that this coloration phenomenon may be explained by the formation of a digressive layer of oxide between the surface of the metal and the maximum depth implanted, which is reflected by the formation of an index gradient favorable, along the thickness of the implanted layer, to the reflection of certain colors which can vary from red, for the smallest implantation thicknesses, to blue, for the greatest implantation thicknesses. The exposure temperature of the heat treatment acts as an accelerator of the kinetics of oxidation of the implanted layer. The exposure time makes it possible to adjust the depth of the oxidized layer in the region allowed by the implanted layer. The inventors estimate between 1 min and 4 hours the time necessary to scan the entire range of shades accessible between 100 and 400° C. in the dose range and implantation depth range which are specified by the invention. The inventors have observed that an excessively high temperature can, for example, promote an excessively rapid diffusion of the implanted entities and bring about neutralization of the color, which then tends towards the color of the starting substrate. The inventors consider that the implanted entity appears to promote the oxidation procedure by employing a complex combination of phenomena which are as follows:
  preferential sputtering creating depletion regions for some entities participating in the composition of the metal (for example chromium for a stainless steel),
  the formation of defects promoting the mobility of the oxygen in the metal,
  the disruption of the chemical composition in the implanted region directing the production of such metal oxide and/or sub-oxide type.

According to different embodiments, which can be combined:

- the dose of mono- and multicharged ions of the gas per unit of surface area is greater than or equal to $5 \times 10^{16}$ ions/cm$^2$, for example greater than or equal to $10^{17}$ ions/cm$^2$;
- the acceleration voltage of the mono- and multicharged ions of the gas is between 10 kV and 40 kV;
- the beam of mono- and multicharged ions of the gas comprises 10% of multicharged ions or more than 10% of multicharged ions;
- the acceleration voltage is chosen in order to obtain an implanted thickness equal to a multiple of 100 nm (thickness=p×100 nm with p an integer);
- the dose of mono- and multicharged ions of the gas which are implanted per unit of surface area is chosen in order to achieve an atomic concentration of implanted ions of greater than or equal to 10% which is sufficient to bring about a modification to the oxidation procedure favorable to the creation of a significant index gradient in order to filter, with a very high selectivity, the color chosen;
- the metal material is movable with respect to the beam of mono- and multicharged ions of the gas at a rate, $V_D$, of between 0.1 mm/s and 1000 mm/s; according to one embodiment, one and the same region of the steel material is moved under the beam of mono- and multicharged ions of the gas according to a plurality, N, of passes at the rate $V_D$;
- the metal material is exposed to ambient air at a temperature of 100° C. for aluminum alloys, 300° C. for steels and 400° C. for titanium alloys over a time of between 1 min and 4 hours in order to produce, according to the exposure time, a range of shades which is associated with the procedure for oxidation of the surface;
- the metal material is chosen from a steel, a titanium alloy, an aluminum alloy, a cobalt alloy, a copper alloy or a gold alloy. According to one embodiment, the metal material is chosen from a steel, a titanium alloy or an aluminum alloy.

According to the present invention, the mono- and multicharged ions of the gas are produced by an electron cyclotron resonance (ECR) source which has the advantage of being compact and economical in energy.

The present invention is targeted at the coloration of a metal part comprising at least one surface colored with an implanted ion, characterized in that the portion treated according to any one of the above embodiments exhibits a different color from the starting color of the untreated part. This difference can be assessed statistically with a representative population of 100 people to whom 10 parts to be differentiated with regard to the shade (9 untreated parts, one treated part) are submitted. If 90% of this population find the treated part, it is considered that the difference well and truly exists.

The present invention is also targeted at the use of the treatment process, according to any one of the above embodiments, for treating a bulk metal part chosen from the list consisting of a watch part (for example plate, hand, pallet, and the like), of a place setting (for example knife, fork, spoon, and the like) or of a jewel.

The present invention is also targeted at the use of masking to produce a pattern with an extreme line fineness for the purpose of exhibiting, on the treated portion, a different color from an untreated portion.

The invention is targeted at the creation, by masking, of different treatment regions which are superimposed, accumulating the doses during successive treatments, so that these different doses (associated with these treatment regions) reveal different shades during one and the same exposure time at a given temperature. For example, for a part made of steel: creation, by masking, of a square treated with a given dose d1 (the dose d1 is, for example, associated with red for an exposure of 1 h at 300° C.), then creation, by masking, of a circle confined within the square, treated with a dose d2 (the accumulated dose (d1+d2) in the circle is, for example, associated with blue for an exposure of 1 h at 300° C.), and finally exposure of the part for 1 h at 300° C. in order to reveal a blue circle confined on a background represented by a red square. The invention exhibits, as advantages, those of being able to obtain, by masking, patterns with a micrometric accuracy (that of the implantation depth), with a noteworthy line fineness and highly reproducible colors.

The invention is also targeted at parts treated at high doses (for example greater than or equal to $10^{18}$ ions/cm$^2$) by a implantation/diffusion carried out with a local temperature regulated by adjusting the rate of movement and the power of the beam with the aim of obtaining a treated surface which is more resistant mechanically (treated depth greater than 1 micron). "Implantation/diffusion" is understood to mean a method for the treatment of a metal portion of a part where a surface of said metal portion is subjected to a beam of ions so as to implant ions of the beam in an implantation region and to make possible the diffusion of ions into an implantation/diffusion region, for example of between 0.1 μm and 1000 μm; such a method is described in the document WO2010063928, incorporated by way of reference. Under these conditions, it is possible to obtain, on these implanted/diffused parts, which are then exposed to ambient air at a given temperature within a given time (according to the process of the invention), colors within a more restricted range of shades but with the advantage of being able to be exactly restored in the event of scratching. The inventors have, for example, observed the appearance of a royal blue color for a part made of 304L steel implanted/diffused with a dose of nitrogen of $4.5 \times 10^{18}$ ions/cm$^2$ at a local temperature of approximately 340° C., then cooled under vacuum (in order to avoid a poorly controlled post-oxidation) and finally exposed in an ambient air oven to 300° C. for 1 hour. Hardness measurements have demonstrated an increase in hardness equal to 160% at a depth of approximately 4 microns (300 HV→800 HV). After stripping (over a thickness of approximately 100 nm) the treated part with diamond paste, the part retains its gain in hardness but experiences the disappearance of its royal blue color, replaced by the starting color of the part (silvery gray). Putting the part back in the oven in ambient air at 300° C. for one hour made it possible to restore the royal blue color without damaging the gain in hardness. The inventors have observed that the formation of a royal blue color took place only in the region implanted with nitrogen, the untreated region retaining its starting color (silvery gray).

BRIEF DESCRIPTION OF THE DRAWINGS

Other distinguishing features and advantages of the present invention will emerge in the description below of non-limiting exemplary embodiments illustrated by the appended figures, where.

DETAILED DESCRIPTION

Figure 1:
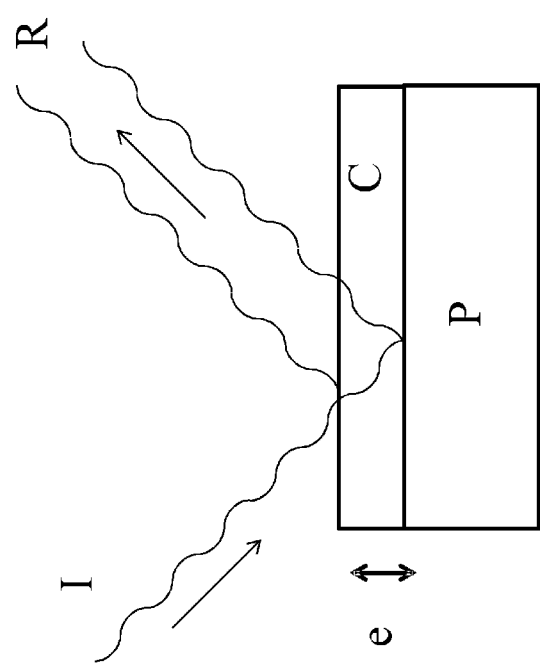
FIG. 1 describes the procedure for reflection of an incident wave through the layer created in a metal by the process of the invention in order to produce a shade.

According to implementational examples of the present invention, polished samples made of 304L steel were made the subject of studies, with mono- and multicharged nitrogen ions.

The inventors carried out a campaign of tests with a beam of mono- and multicharged nitrogen ions with an intensity of 5 mA comprises $N^+$, $N^{2+}$ and $N^{3+}$ ions; the acceleration voltage is 35 kV; the $N^+$ energy is 35 keV, the $N^{2+}$ energy is 70 keV and the $N^{3+}$ energy is 105 keV. The treatment dose is equal to $5 \times 10^{17}$ ions/cm². These energies are sufficient to create an implanted layer estimated by the inventors at approximately 100 nm.

These mono- and multicharged ions of the gas were emitted by an ECR source.

The samples are at ambient temperature during the treatment with the mono- and multicharged nitrogen ions.

The treated samples move in a series of to-and-fro movements with respect to the beam with a diameter equal to 60 mm, with a rate of movement of 80 mm/s and at an advancement step at each to-and-fro movement corresponding to a fraction of the beam diameter equal to 20% in order to guarantee homogeneity of the treatment. Several passes were required to reach the required dose equal to $5 \times 10^{17}$ ions/cm².

The samples were thus subjected, after treatment, in an ambient air oven, to different temperatures and different exposure times in order to reveal colors. The colors observed with the naked eye by the inventors are summarized in the table below:

| Dose ($10^{17}$ N ions/cm²) | Temperature (° C.) | Exposure time (%) | Color observed |
|---|---|---|---|
| 0 | Reference sample | | Silvery gray |
| 0 | 300° C. | 1 h | Silvery gray |
| 5 | Treated sample | | Golden yellow |
| 5 | 250° C. | 1 h | Purple |
| 5 | 300° C. | ¼ h | Crimson |
| 5 | 300° C. | ½ h | Purple |
| 5 | 300° C. | 1 h | Blue |
| 5 | 350° C. | 4 h | Silvery pale pink |

The inventors retain from this table that the time necessary to reveal a substantially identical color (for example purple) is two times greater when the temperature is lower by 50° C. (when the temperature changes from 300° C. to 250° C.). This delay is explained by a slowing in the oxidation procedure in the implanted layer. The reference sample (304L stainless steel) exhibits an unchanged color after a heat treatment in an ambient air oven at 300° C. for 1 hour (silver color, no oxidation procedure). The treated sample promotes the appearance of a golden yellow color which is gradually converted into crimson (red/blue mixture), into purple and then into blue. For a high temperature (350° C.) and an exposure time equal to 4 h, the color tends towards a silvery pale pink color. This can be explained by the diffusion of the implanted entity (nitrogen) and, with it, the diffusion of its oxides. This has the effect of creating a deep oxidized layer in keeping with the reflecting of the large wavelengths (red). By amplifying the effect, the range of filtering of the visible waves is left behind and there is a gradual return toward the starting silvery gray color.

The inventors immersed the colored samples in a sodium hydroxide solution for 15 min and observed no change in color, thus confirming that the implanted layer has indeed been oxidized until it forms a compact passivated protective layer (in contrast to the PVD deposits, which have a porous columnar structure).

The inventors also treated polished samples made of 316L steel with mono- and multicharged nitrogen ions, under the following conditions:

The samples are at ambient temperature during the treatment with the mono- and multicharged nitrogen ions. The beam of mono- and multicharged nitrogen ions has an intensity of 5 mA comprises $N^+$, $N^{2+}$ and $N^{3+}$ ions; the acceleration voltage is 35 kV. The treatment dose is equal to $5 \times 10^{17}$ ions/cm².

The samples were subsequently treated in an ambient air oven at 300° C. and for different exposure times in order to reveal colors. The colors observed with the naked eye by the inventors are summarized in the table below:

| Exposure time at 300° C. | Color |
|---|---|
| 10 min | Dark red |
| 30 min | Dark red-purple |
| 32.5 min | Dark purple |
| 37.5 min | Midnight blue |
| 40 min | Blue |
| 45 min | Light blue |
| 60 min | Pale light blue |

The inventors also treated polished samples made of 316L steel with mono- and multicharged nitrogen ions, under the following conditions:

The samples are at a temperature of 340° C. during the treatment with the mono- and multicharged nitrogen ions (implantation/diffusion conditions). The beam of mono- and multicharged nitrogen ions has an intensity of 5 mA comprises $N^+$, $N^{2+}$ and $N^{3+}$ ions; the acceleration voltage is 35 kV. The treatment dose is equal to $3.3 \times 10^{18}$ ions/cm².

The samples were subsequently treated in an ambient air oven at 300° C. and for different exposure times in order to reveal colors. The colors observed with the naked eye by the inventors are summarized in the table below:

| Exposure time at 300° C. | Color |
|---|---|
| 60 min | Dark gray |
| 90 min | Blue-dark gray |
| 240 min | Gray-blue |

The inventors also treated polished samples made of titanium alloy ($TiAl_6V_4$) with mono- and multicharged nitrogen ions, under the following conditions:

The samples are at ambient temperature during the treatment with the mono- and multicharged nitrogen ions. The beam of mono- and multicharged nitrogen ions has an intensity of 5 mA comprises $N^+$, $N^{2+}$ and $N^{3+}$ ions; the acceleration voltage is 35 kV. The treatment dose is equal to $5 \times 10^{17}$ ions/cm².

The samples were subsequently treated in an ambient air oven at 500° C. and for different exposure times in order to reveal colors. The colors observed with the naked eye by the inventors are summarized in the table below:

| Exposure time at 500° C. | Color |
|---|---|
| 3 min | Brown |
| 5 min | Midnight blue |
| 20 min | Green-blue |
| 50 min | Green-golden yellow |
| 120 min | Olive green |

The inventors also treated polished samples made of titanium alloy (TiAl6V4) with mono- and multicharged nitrogen ions, under the following conditions:

The samples are at a temperature of 370° C. during the treatment with the mono- and multicharged nitrogen ions (implantation/diffusion conditions). The beam of mono- and multicharged nitrogen ions has an intensity of 5 mA comprises $N^+$, $N^{2+}$ and $N^{3+}$ ions; the acceleration voltage is 37.5 kV. The treatment dose is equal to $4.5 \times 10^{18}$ ions/cm$^2$.

The samples were subsequently treated in an ambient air oven at 500° C. and for different exposure times in order to reveal colors. The colors observed with the naked eye by the inventors are summarized in the table below:

| Exposure time at 500° C. | Color |
|---|---|
| 2 min 30 | Dark brown |
| 5 min | Midnight purple-blue |
| 30 min | Blue-gray |
| 60 min | Dark green |
| 300 min | Olive green |

The inventors treated, by the process of the invention, samples made of aluminum alloy (AU4G) with the beam mentioned above for steel, using different doses, respectively equal to 4, 6 and $8 \times 10^{17}$ ions/cm$^2$. The samples are at ambient temperature during the treatment with the mono- and multicharged nitrogen ions.

| Dose ($10^{17}$ N ions/cm$^2$) | Temperature (° C.) | Exposure time (%) | Color observed |
|---|---|---|---|
| 0 | Reference sample | | Silvery gray |
| 4 | 100° C. | 2 h | Blue |
| 6 | 100° C. | 2 h | Yellow |
| 8 | 100° C. | 2 h | Red |

The aluminum alloys differ from steel in so far as the implanted entities cannot diffuse in the temperature range for appearance of the colors (preferably less than 150° C. in order to retain the mechanical properties).

From this table, it appears that the dose acts in the direction of a widening of the implantation profile promoting, during the oxidation procedure, the reflection of the short (blue) wavelengths toward long (yellow then red) wavelengths. Hence the appearance of the red, yellow and blue shades.

As recommended by the process of the invention, the regulating of the acceleration voltage of the ions is calculated so that the implanted thickness is equal to a multiple of approximately 100 nm. It is possible to more finely regulate these values (acceleration voltage, dose, temperature, exposure time) during an experimental adjustment phase using the naked eye. Reference may be made, for this, to a preliminary calibration stage described above.

For all of the results given above, the surface of the treated metal is perpendicular to the direction of the beam of ions (incidence of 0°).

The inventors have been able to find that the incidence of the ion beam can have an influence on the color obtained. It may thus be timely to take into consideration the incidence of the beam of ions when it is desired to treat a nonplanar surface.

By way of example, for a 316L steel treated at ambient temperature with a beam of mono- and multicharged nitrogen ions which comprises $N^+$, $N^{2+}$ and $N^{3+}$ ions, with an intensity of 5 mA, with an acceleration voltage of 35 kV and a treatment dose equal to $5 \times 10^{17}$ ions/cm$^2$, followed by a heat treatment of 30 min at 300° C. in ambient air, it is found that the color is dark red/purple for an angle of incidence of zero and golden yellow for an angle of incidence of 45°.

Consequently, the inventors recommend, in order to have a homogeneous color over a curved surface, a treatment which consists in moving the part and/or the beam so that the implanted thickness and the ion dose are substantially identical to within +/−10%. By way of example, it is possible to rotate a cylindrical surface under a static beam so as to retain a substantially constant angle of incidence. For a static beam, it is considered possible to obtain a homogeneous color over a curved surface provided that the angle of incidence of the beam does not vary by more than 22.5° with respect to the perpendicular at each point of this surface. If the surface does not make it possible to abide by this rule, it is advisable to treat it with a beam oriented along several angles of incidence each associated with the different portions of the surface, so as to observe said rule. By way of example, it is possible to polyhedrize a sphere into a sufficient number of facets to observe this rule.

As a general rule and independently of the nature of the metal (steels, titanium, and the like), the inventors recommend using the lowest possible temperatures to oxidize the implanted layer and to prevent as much as possible the diffusion of the implanted entities which fix the oxidation procedure. This is particularly true in order to produce colors tending toward the red with a low implantation depth, this is because the temperature can easily act in the direction of a widening of the implantation profile favorable to the appearance of a blue color.

The inventors recommend the use of the present invention with other metal alloys, for example with a colorimetric display temperature corresponding to approximately ⅓ M.p. (M.p. being the melting point expressed in ° K), in particular:

cobalt alloy treated by a beam of mono- and multicharged ions of a gas and then displayed by heat treatment at approximately 500° C.;

copper alloy treated by a beam of mono- and multicharged ions of a gas and then displayed by heat treatment at approximately 300° C.;

gold-based alloy treated by a beam of mono- and multicharged ions of a gas and then displayed by heat treatment at approximately 300° C.

FIG. 1 describes the building of the color by constructive/destructive filtering of incident waves (I) reflected (R) through the implanted layer (C) created superficially in a metal part (P). This layer exhibits an oxidation gradient controlled by the process of the invention with a semi-empirical development, the method and the rules of which are described above, for example for steels and aluminum alloys. The adjusting of the thickness (e) of the implanted layer and of its degree of oxidation relative to the temperature and to the exposure time of the heat treatment makes it possible to create a very precise color among a whole range of possible shades for the hue of the metal chosen (steel, titanium alloy, aluminum alloy or other).

Figure 2:
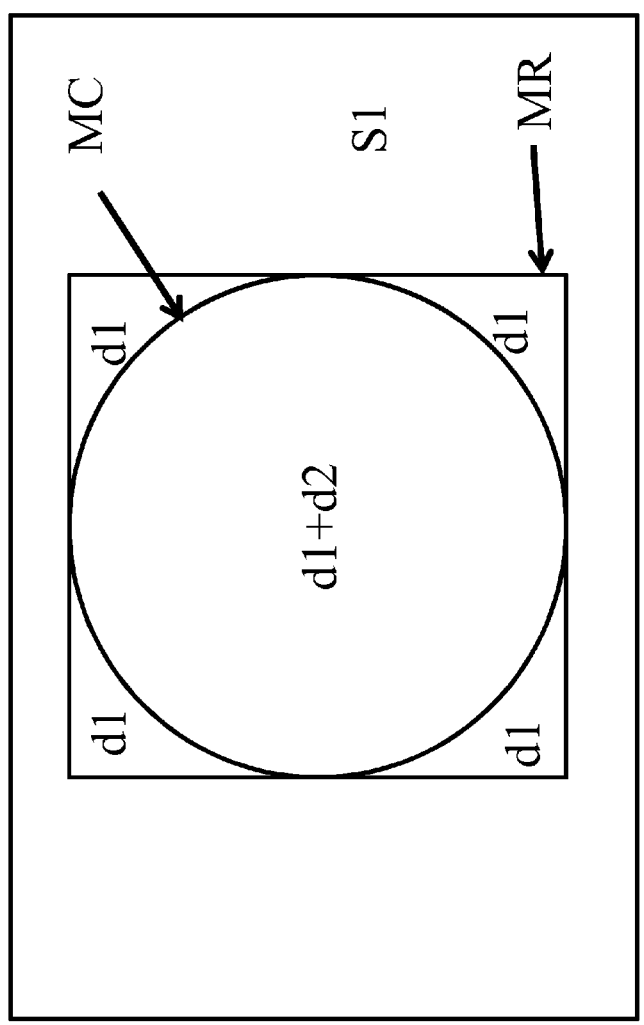
FIG. 2 describes the masking procedure which makes possible the creation of distinct colored regions appearing during one and the same heat treatment operation.

FIG. 2 describes the example of building a pattern corresponding to a circle (with the outline MC) inscribed within a square (with the outline MR) on a metal surface S1. A first square mask (hollowed out at its center along the outline MR) is applied to the metal surface S1, through which a dose d1 is implanted in a square region with the outline MR. Subsequently, in addition, a portion of the square region is masked with a circular mask (hollowed out at its center along the outline MC) in order to treat, through the latter, a circular region within the outline MC with a dose d2. After one and the same heat treatment operation according to the process of the invention to reveal the colors, the region accumulating a dose (d1+d2) appears under a first color, the region treated with the dose d1 appears with a separate color and, finally, the masked metal surface (thus not treated and located outside the outline MR) appears under its starting color.

The invention claimed is:

1. A treatment process for coloring a metal, comprising:
  a) bombarding the metal with a beam of mono- and multicharged ions of a gas produced by an electron cyclotron resonance (ECR) source, wherein:
    a dose of mono- and multicharged ions of the gas implanted per unit of surface area by the bombardment is in a range of between $10^{16}$ ions/cm$^2$ and $10^{19}$ ions/cm$^2$,
    a single acceleration voltage is applied, said single acceleration voltage has a value in a range of between 5 kV and 1000 kV; and
  b) performing a heat treatment for coloring the implanted metal, wherein:
    the heat treatment is performed at a temperature of between 100° C. and 600° C. for an exposure time of between 1 min and 4 hours.

2. The process as claimed in claim 1, wherein the mono- and multicharged ions of the gas of the beam of ions are ions of the elements selected from the group consisting of helium (He), neon (Ne), argon (Ar), krypton (Kr) and xenon (Xe).

3. The process as claimed in claim 1, wherein the mono- and multicharged ions of the gas of the beam of ions are ions of the gases selected from the group consisting of nitrogen ($N_2$) and oxygen ($O_2$).

4. The process as claimed in claim 1, wherein the mono- and multicharged ions of the gas are all ions of one and the same atomic compound.

5. The process as claimed in claim 4, wherein the atomic compound is a gas at ambient temperature.

6. The process of claim 4, wherein the mono- and multicharged ions of the gas from all ions of one and the same atom or of one and the same diatomic molecule.

7. The process as claimed in claim 1, wherein the beam of mono- and multicharged ions of the gas comprises 10% of multicharged ions or more than 10% of multicharged ions.

8. The process of claim 7, wherein the beam of mono- and multicharged ions of the gas comprises 30% of multicharged ions or more than 30% of multicharged ions.

9. The process as claimed in claim 1, wherein the heat treatment is carried out in ambient air.

10. The process as claimed in claim 1, wherein the acceleration voltage is chosen in order to obtain an implanted thickness equal to p* 100 nm, where p is an integer.

11. The process as claimed in claim 1, wherein the metal is selected from the group consisting of steels, titanium alloys, aluminum alloys, cobalt alloys, copper alloys and gold alloys.

12. The process of claim 1, wherein the metal is a bulk metal part selected from the group consisting of a watch part, a place setting and a jewel.

13. The process of claim 1, wherein the heat treatment is performed a temperature of between 100° C. and 400° C.

14. A treatment process for coloring a metal, comprising:
  a) bombarding the metal with a beam of mono-and multicharged ions of a gas produced by an electron cyclotron resonance (ECR) source, wherein:
    the dose of mono- and multicharged ions of the gas implanted per unit of surface area by the bombardment is in a range of between $10^{16}$ ions/cm$^2$ and $10^{19}$ ions/cm$^2$, and the dose of mono- and multicharged ions of the gas which are implanted per unit of surface area is chosen in order to achieve an atomic concentration of implanted ions of greater than or equal to 10%, and
    an acceleration voltage is in a range between 5 KV and 1000 kV; and
  b) performing a heat treatment for coloring the implanted metal, wherein:
    the heat treatment is performed at a temperature of between 100° C. and 600° C. for an exposure time of between 1 min and 4 hours.

15. A treatment process for coloring a metal, comprising:
  a) bombarding the metal with a beam of mono- and multicharged ions of a gas produced by an electron cyclotron resonance (ECR) source, wherein:
    the metal is movable with respect to the beam of mono- and multicharged ions of the gas at a rate, $V_D$, of between 0.1 mm/s and 1000 mm/s
    a dose of mono- and multicharged ions of the gas implanted per unit of surface area by the bombardment is in a range of between $10^{16}$ ions/cm$^2$ and $10^{19}$ ions/cm$^2$, and
    an acceleration voltage is in a range of between 5 kV and 1000 kV; and
  b) performing a heat treatment for coloring the implanted metal, wherein:
    the heat treatment is performed at a temperature of between 100° C. and 600° C. for an exposure time of between 1 min and 4 hours.

16. The process as claimed in claim 15, wherein one and the same region of the metal is moved under the beam of mono- and multicharged ions of the gas according to a plurality, N, of passes at the rate $V_D$.

* * * * *